United States Patent
Fang et al.

(10) Patent No.: US 12,426,439 B2
(45) Date of Patent: Sep. 23, 2025

(54) DISPLAY PANEL

(71) Applicant: Hefei Visionox Technology Co., Ltd., Anhui (CN)

(72) Inventors: Xuyang Fang, Hefei (CN); Mingxing Liu, Hefei (CN); Xiaoling Li, Hefei (CN); Shizhen Feng, Hefei (CN); Yantao Guan, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 357 days.

(21) Appl. No.: 17/965,131

(22) Filed: Oct. 13, 2022

(65) Prior Publication Data
US 2023/0031673 A1    Feb. 2, 2023

Related U.S. Application Data

(63) Continuation of application No. PCT/CN2021/097246, filed on May 31, 2021.

(30) Foreign Application Priority Data

Jul. 23, 2020  (CN) .......... 202010715848.8

(51) Int. Cl.
*H10K 50/84*  (2023.01)
*H10K 50/852*  (2023.01)
(Continued)

(52) U.S. Cl.
CPC .......... *H10K 50/84* (2023.02); *H10K 50/852* (2023.02); *H10K 50/858* (2023.02); *H10K 59/121* (2023.02)

(58) Field of Classification Search
CPC .......... H10K 50/84; H10K 50/85–865; H10K 50/844–8445; H10K 59/121;
(Continued)

(56) References Cited

U.S. PATENT DOCUMENTS

| 2006/0049749 | A1 | 3/2006 | Ishikawa et al. | |
| 2008/0049431 | A1* | 2/2008 | Boek .......... | H10K 50/86 |
| | | | | 362/311.06 |

(Continued)

FOREIGN PATENT DOCUMENTS

| CN | 101091269 A | 12/2007 |
| CN | 109524568 A | 3/2019 |

(Continued)

OTHER PUBLICATIONS

International Search Report mailed Aug. 17, 2021, in corresponding International Application No. PCT/CN2021/097246, 11 pages (with English Translation).

(Continued)

*Primary Examiner* — Steven B Gauthier
*Assistant Examiner* — Adam D Weiland
(74) *Attorney, Agent, or Firm* — Maier & Maier, PLLC

(57) ABSTRACT

A display panel, which includes: a substrate; a light-emitting element layer disposed on the substrate, including a plurality of light-emitting elements; an encapsulation layer disposed on one side of the light-emitting element layer away from the substrate; and a light energy adjustment layer disposed between the light-emitting element layer and the encapsulation layer, the light energy adjustment layer being capable of converting each wave train of light passing through it into a wave packet. Characteristic length of the wave packet is less than length of the wave train.

18 Claims, 9 Drawing Sheets

(51) Int. Cl.
*H10K 50/858* (2023.01)
*H10K 59/121* (2023.01)

(58) Field of Classification Search
CPC .... H10K 59/873; H10K 59/878; H10K 59/12; H01L 23/562–576
See application file for complete search history.

(56) References Cited

U.S. PATENT DOCUMENTS

| | | |
|---|---|---|
| 2010/0171106 A1 | 7/2010 | Jung et al. |
| 2010/0200845 A1 | 8/2010 | Jeong et al. |
| 2011/0122053 A1 | 5/2011 | Jeong et al. |
| 2017/0018602 A1 | 1/2017 | Yun et al. |
| 2020/0006439 A1 | 1/2020 | Sun et al. |
| 2020/0243801 A1* | 7/2020 | Xu ...................... H10K 50/858 |

FOREIGN PATENT DOCUMENTS

| | | |
|---|---|---|
| CN | 110444686 A | 11/2019 |
| CN | 111223912 A | 6/2020 |
| CN | 111370457 A | 7/2020 |
| CN | 111834550 A | 10/2020 |
| JP | 2003-133062 A | 5/2003 |
| WO | 2020052232 A1 | 3/2020 |

OTHER PUBLICATIONS

The First Office Action dated Oct. 18, 2021, in corresponding Chinese Application No. 202010715848.8, 10 pages (with English Translation).

* cited by examiner

DISPLAY PANEL

CROSS-REFERENCE TO RELATED APPLICATIONS

This application is a continuation of International Application No. PCT/CN2021/097246, filed on May 31, 2021, which claims priority to Chinese Patent Application No. 202010715848.8 filed on Jul. 23, 2020, all of which are hereby incorporated by reference in their entireties.

FIELD

The present application relates to the field of display, in particular to a display panel.

BACKGROUND

Organic light emitting diode (Organic Light Emitting Diode, OLED) display panel is an active light-emitting display panel. OLED display technology has the advantages of simple preparation process, low cost, high contrast, wide viewing angle and low power consumption. It has become a mainstream flat panel display technology.

As the existing OLED display panel displays pure white pictures, it will produce an appearance with multiple color stripes in some viewing angles, that is, a problem of rainbow pattern exists.

SUMMARY

The embodiment of the present application provides a display panel, which improves the rainbow pattern problem of the display panel under some viewing angles.

An embodiment of the present application provides a display panel, comprising a substrate; a light-emitting element layer disposed on the substrate, the light-emitting element layer comprises a plurality of light-emitting elements; an encapsulation layer disposed on one side of the light-emitting element layer away from the substrate; and a light energy adjustment layer disposed between the light-emitting element layer and the encapsulation layer, the light energy adjustment layer being capable of converting each wave train passed by light into a wave packet, wherein a characteristic length of the wave packet is less than a wave train length of the wave train.

According to the display panel of the embodiment of the present application, a vacuum gap is provided between the encapsulation layer and the light-emitting element layer. It is found by the applicant that a first optical microcavity may be formed between the encapsulation layer and the light-emitting element layer, and the light emitted by a plurality of light-emitting elements of the light-emitting element layer is emitted outward through the first optical microcavity. In this case, as viewing at a certain angle with a display surface of the display panel, an emission spectrum of the display panel at the viewing angle will change due to passing through the first optical microcavity between the encapsulation layer and the light-emitting element layer, so that the display panel will produce an appearance with multiple color stripes in the viewing angles when it displays pure white pictures, that is, rainbow pattern exists. The display panel of the embodiment of the present application includes a light energy adjustment layer, which is located between the light-emitting element layer and the encapsulation layer. The light energy adjustment layer may convert each wave train passed by light into a wave packet, wherein a characteristic length of the wave packet is less than a wave train length of the wave train, that is, the length of each wave train is compressed, so that the possibility of interference between the upper and lower surfaces of the first optical microcavity between the encapsulation layer and the light-emitting element layer is reduced after the passing light is converted into a wave packet, so as to reduce the influence of the first optical microcavity between the encapsulation layer and the light-emitting element layer on the emission spectrum of the display panel under the preset viewing angle, weaken the conditions for the generation of rainbow patterns, and improve the rainbow patterns on the display panel under some viewing angles.

According to any of the foregoing implementations of the embodiments of the present application, a vacuum gap is provided between the encapsulation layer and the light-emitting element layer to form an optical microcavity.

According to any of the foregoing implementations of the embodiments of the present application, the display panel further comprises a driving array layer between the substrate and the light-emitting element layer, the driving array layer includes a plurality of pixel driving circuits, and each pixel driving circuit is electrically connected to the light-emitting element corresponding to the pixel driving circuit.

According to any of the foregoing implementations of the embodiments of the present application, the substrate includes a display area and a non-display area surrounding peripheries of the display area, a recess in the display area is provided on a surface of the substrate facing the light-emitting element layer. The display panel further comprises a driving array layer between the substrate and the light-emitting element layer, the driving array layer is disposed in the display area and the non-display area, wherein the driving array layer comprises a first surface facing the encapsulation layer. The first surface comprises a first sub-surface in the display area and a second sub-surface in the non-display area, a distance between the first sub surface and the encapsulation layer is greater than a distance between the second sub surface and the encapsulation layer.

According to any of the foregoing implementations of the embodiments of the present application, the substrate includes a display area and a non-display area surrounding peripheries of the display area, the light-emitting element layer is disposed in the display area. The display panel further comprises: a driving array layer between the substrate and the light-emitting element layer, the driving array layer being disposed in the display area and the non-display area; an encapsulation connecting member arranged around the display area in the non-display area, the encapsulation connecting member being connected between the driving array layer and the encapsulation layer.

According to any of the foregoing implementations of the embodiments of the present application, the display panel further includes: an encapsulation layer heightening part connected between the encapsulation connecting member and the driving array layer, and/or between the encapsulation connecting member and the encapsulation layer.

BRIEF DESCRIPTION OF THE DRAWINGS

By reading the following detailed description of the non-limiting embodiments with reference to the accompanying drawings, other features, objects and advantages of the present application will become more obvious, in which the same or similar reference numerals represent the same or similar features, and the accompanying drawings are not drawn to actual scale.

DETAILED DESCRIPTION

Features and exemplary embodiments of various aspects of the present application will be described in detail below. In order to make the purpose, technical solutions, and advantages of the present application clearer, the present application will be described in detail below with reference to the accompanying drawings and specific embodiments. It should be understood that the specific embodiments described herein are only configured to explain the present application, and not configured to limit the present application. For those skilled in the art, the present application can be implemented without some of these specific details. The following description of the embodiments is only to provide a better understanding of the present application by showing examples of the present application.

It should be noted that in this application, relational terms such as first and second are only used to distinguish one entity or operation from another entity or operation, and do not necessarily require or imply any actual relationship or order between these entities or operations.

The embodiment of the present application provides a display panel, which may be an organic light emitting diode (Organic Light Emitting Diode; OLED) display panel.

Figure 1:
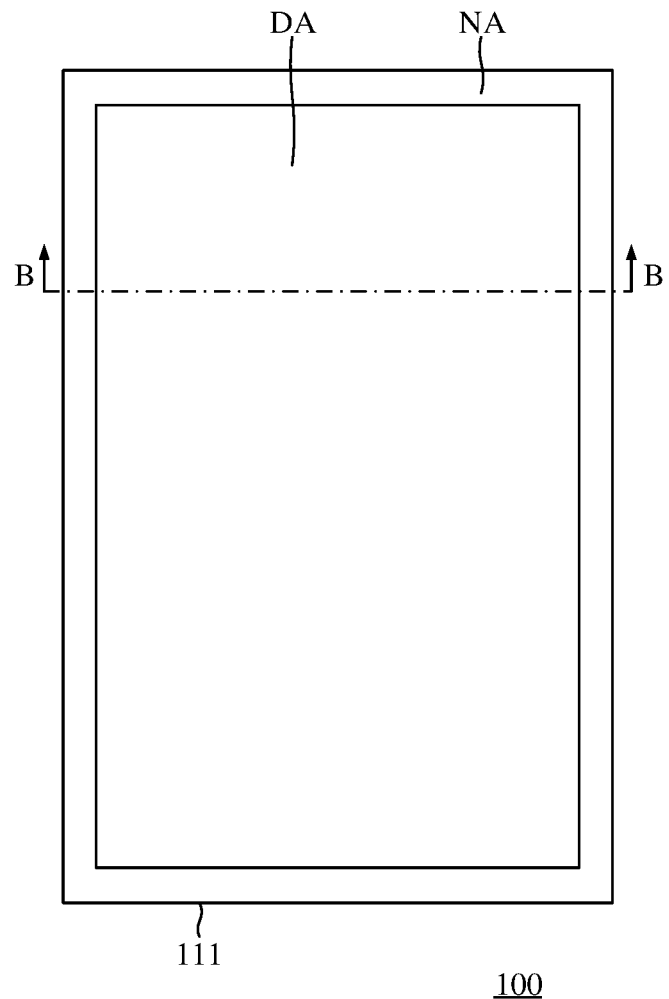
FIG. 1 is a schematic top view of a display panel provided according to a first embodiment of the present application.
Figure 2:
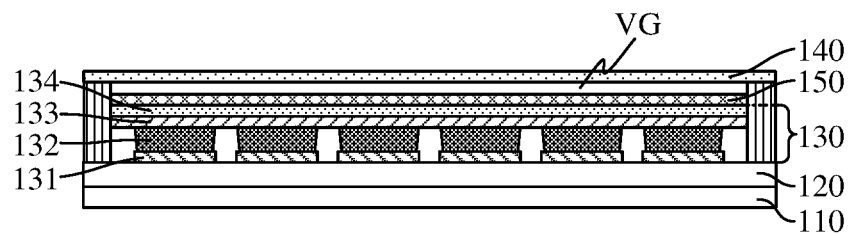
FIG. 2 is a schematic cross-sectional view of the display panel provided according to the first embodiment of the present application.

FIG. 1 and FIG. 2 are respectively a top view and a cross-sectional view of the display panel provided according to a first embodiment of the present application. Line B-B in FIG. 1 shows a cut position of the cross-sectional view of FIG. 2. The display panel 100 includes a substrate 110, a light-emitting element layer 130, an encapsulation layer 140, and a light energy adjustment layer 150. The light emitting element layer 130 is disposed on the substrate 110. The encapsulation layer 140 is disposed on one side of the light-emitting element layer 130 away from the substrate 110. In some embodiments, the display panel 100 also includes a driving array layer 120 disposed between the substrate 110 and the light-emitting element layer 130.

If the display panel 100 is a flexible display panel, the substrate 110 is, for example, a flexible substrate made of polyimide (Polyimide, PI), polyethylene terephthalate (polyethylene terephthalate, PET) and other materials. If the display panel 100 is a hard display panel, the substrate 110 may be a hard substrate made of materials such as glass. In this embodiment, the display panel 100 is a hard display panel as an example, and the substrate 110 is, for example, a glass substrate.

In some embodiments, the substrate 110 includes a display area DA and a non-display area NA surrounding peripheries of the display area DA. The light-emitting element layer 130 is disposed in the display area DA, and the light-emitting element layer 130 includes a plurality of light-emitting elements. The light-emitting element may be an OLED light-emitting element. The driving array layer 120 may be disposed in the display area DA and the non-display area NA. The driving array layer 120 may include a plurality of pixel driving circuits, each of which is electrically connected to the light-emitting element corresponding to the pixel driving circuit, so that the light-emitting element corresponding to the pixel driving circuit can be driven for display. A forward projection of the encapsulation layer 140 on the substrate 110 covers a forward projection of the plurality of light-emitting elements of the light-emitting element layer 130 on the substrate 110. In some embodiments, the encapsulation layer 140 is a hard encapsulation layer, such as a glass encapsulation layer. In some embodiments, a vacuum gap VG is disposed between the encapsulation layer 140 and the light-emitting element layer 130 to form an optical microcavity.

The display panel 100 includes a light energy adjustment layer 150 between the light-emitting element layer 130 and the encapsulation layer 140. The light energy adjustment layer 150 may convert each wave train passed by light into a wave packet, wherein a characteristic length of the wave packet is less than a wave train length of the wave train.

Figure 3:
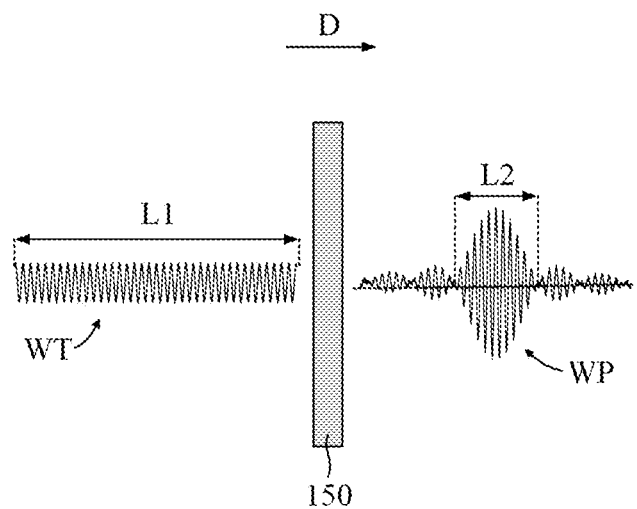
FIG. 3 is a schematic diagram of the principle of passing light adjustment of a light energy adjustment layer in the display panel provided according to the first embodiment of the present application.

FIG. 3 is a schematic diagram of the principle of passing light adjustment of a light energy adjustment layer in the display panel provided according to the first embodiment of the present application, wherein an arrow D shows light propagation direction. In this application, the light energy adjustment layer 150 is a film layer capable of compressing each wave train WT passed by light into a wave packet WP with energy accumulation. As the light propagates through the light energy adjustment layer 150, the wave train WT of the incident side light has a wave train length L1, the wave packet WP of the outgoing side light contains most of the light energy in the corresponding wave train WT, and the wave packet WP has a characteristic length L2, which is less than the wave train length L1 of the corresponding wave train WT.

According to the display panel 100 of the embodiment of the present application, a vacuum gap VG is provided between the encapsulation layer 140 and the light-emitting element layer 130. It is found by the applicant that a first optical microcavity may be formed between the encapsulation layer 140 and the light-emitting element layer 130, and the light emitted by a plurality of light-emitting elements of the light-emitting element layer 130 is emitted outward through the first optical microcavity. In this case, as viewing at a certain angle with a display surface of the display panel 100, an emission spectrum of the display panel 100 at the viewing angle will change due to passing through the first optical microcavity between the encapsulation layer 140 and the light-emitting element layer 130, so that the display panel 100 will produce an appearance with multiple color stripes in the viewing angles when it displays pure white pictures, that is, rainbow pattern exists.

The display panel 100 of the embodiment of the present application includes a light energy adjustment layer 150, which is disposed between the light-emitting element layer 130 and the encapsulation layer 140. The light energy adjustment layer 150 may convert each wave train WT passed by light into a wave packet WP, wherein a characteristic length L2 of the wave packet WP is less than a wave train length L1 of the wave train WT, that is, the length of each wave train WT is compressed, so that the possibility of interference between the upper and lower surfaces of the first optical microcavity between the encapsulation layer 140 and the light-emitting element layer 130 is reduced after the passing light is converted into a wave packet WP, so as to reduce the influence of the first optical microcavity between the encapsulation layer 140 and the light-emitting element layer 130 on the emission spectrum of the display panel 100 under the preset viewing angle, weaken the conditions for the generation of rainbow patterns, and improve the rainbow patterns on the display panel 100 under some viewing angles.

In some embodiments, the light energy adjustment layer 150 has a preset refractive index and thickness. The light energy adjustment layer 150 may be a high refractive index film layer, which involves film interference superposition effect to convert a wave train WT into a wave packet WP to realize the adjustment of light energy. The light energy adjustment layer 150 may include at least one of a titanium dioxide layer and a zinc oxide layer. For example, the light energy adjustment layer 150 is a titanium dioxide layer, so that the light energy adjustment layer 150 has a higher refractive index. In this case, the conversion of wave packet WP can be realized with a thinner light energy adjustment layer 150. The light energy adjustment layer 150 is not limited to an inorganic film layer, and in some other embodiments, the light energy adjustment layer 150 may be an organic film layer with a high refractive index.

The light energy adjustment layer 150 may be a single-layer film structure or a laminated film system. The light energy adjustment layer 150 may be located anywhere between the light-emitting element layer 130 and the encapsulation layer 140. For example, the light energy adjustment layer 150 is disposed on a surface of the light-emitting element layer 130 facing the encapsulation layer 140. The formation method of the light energy adjustment layer 150 includes but is not limited to adhering, sputtering, electron beam evaporation, chemical vapor deposition (Chemical Vapor Deposition, CVD), evaporation or incoming integration with the substrate.

In some embodiments, light energy of the wave packet WP accounts for more than 90% of light energy of the wave train WT corresponding to the wave packet, that is, the minimum energy ratio η that can be ignored during light energy adjustment is 10%. Wherein the negligible minimum energy ratio η refers to the ratio of a light energy outside the wave packet WP (i.e. the light energy of the neglected portion) to a light energy of the original wave train WT during of light energy adjustment. The light energy of the wave packet WP accounts for more than 90% of the light energy of the wave train WT corresponding to the wave packet, so that the wave packet WP retains most of the light energy of the corresponding wave train WT and alleviates the problem of the reduction of the display brightness of the display panel 100 caused by the addition of the light energy adjustment layer.

In some embodiments, the refractive index and thickness of the light energy adjustment layer 150 satisfy the following formula:

$$0.5(1-4ndM) \leq 1.1H \quad (1)$$

In formula (1), n is the refractive index of the light energy adjustment layer 150; d is the thickness of the light energy adjustment layer 150; M is a positive integer constant; H is a thickness of the vacuum gap VG. Wherein, for example, M is 1. A first optical microcavity is formed between the encapsulation layer 140 and the light-emitting element layer 130. In formula (1), 0.5 (1−4ndM) is equivalent to half of the optical path (i.e. half optical path) between the upper and lower surfaces of the first optical microcavity, which is less than or equal to 1.1 times the thickness H of the vacuum gap VG, so that it is ensured that the light emitted by the light-emitting element will not interfere on the upper surface of the first optical microcavity, and the influence of the first optical microcavity on the emission spectrum of the display panel 100 is avoided, so as to eliminate the rainbow pattern of the display panel 100 at some viewing angles.

In some embodiments, the light energy adjustment layer 150 satisfies the following formulas:

$$(n-n_1)/(n_1+n) = r_1 \quad (2)$$

$$(n-n_2)/(n_2+n) = r_2 \quad (3)$$

$$(r_1 r_2)^{2M} \leq \eta \quad (4)$$

$$\delta = L2/L1 = (1-4ndM)/(n_1 L1) \quad (5)$$

In formulas (2), (3), (4) and (5), n is a refractive index of the light energy adjustment layer 150; $n_1$ is a refractive index of the material on the incident side of the light energy adjustment layer 150; $n_2$ is a refractive index of the material on the outgoing side of the light energy adjustment layer 150; $r_1$ is an amplitude refractive index on the incident side of the light energy adjustment layer 150; r2 is an amplitude refractive index on the outgoing side of the light energy adjustment layer 150; M is a positive integer value constant, for example, 1; d is a thickness of the light energy adjustment layer 150; η is the minimum energy ratio that can be ignored in light energy adjustment; and δ is the ratio of a characteristic length L2 of the wave packet to a wave train length L1 corresponding to the wave train.

In the above described embodiment, the light energy adjustment layer 150 is disposed on a surface of the light-emitting element layer 130 facing the encapsulation layer 140, wherein the light-emitting element layer 130 may include a plurality of sub light-emitting element layers, and the plurality of sub light-emitting element layers include a top sub layer farthest from the substrate 110. In the embodiment related to FIG. 2, the refractive index $n_1$ of the material on the incident side of the light energy adjustment layer 150 is the refractive index of the top sub layer of the light-emitting element layer 130. The refractive index $n_2$ of the material on the outgoing side of the light energy adjustment layer 150 is the refractive index of the vacuum gap VG.

In some embodiments, the light-emitting element layer 130 includes a first electrode layer, an emitting layer (Emitting Layer, EML), and a second electrode layer sequentially arranged in a direction away from the substrate 110. In this case, the top sub layer is the second electrode layer. In the embodiment related to FIG. 2, the light-emitting element layer 130 includes a first electrode layer 131, a light-emitting layer 132, a second electrode layer 133 and a capping layer (Capping Layer, CPL) 134 sequentially arranged in a direction away from the substrate 110. In this case, the top sub layer is the capping layer 134. One of the first electrode layer 131 and the second electrode layer 133 described above is an anode layer and the other is a cathode layer. For example, the first electrode layer 131 is an anode layer and the second electrode layer 133 is a cathode layer. In addition, in some embodiments, a carrier layer such as a hole injection layer (Hole Inject Layer, HIL), a hole transport layer (Hole Transport Layer, HTL), and an electron blocking layer (Electron Blocking Layer, EBL) may also be included between the first electrode layer 131 and the light emitting layer 132. In some embodiments, a carrier layer such as an electron injection layer (Electron Inject Layer, EIL), an electron transport layer (Electron Transport Layer, ETL), and a hole blocking layer (Hole Blocking Layer, HBL) may also be included between the light emitting layer 132 and the second electrode layer 133.

By configuring the refractive index n and thickness d of the light energy adjustment layer 150 to satisfy the above formulas (2), (3), (4) and (5), the light energy adjustment layer 150 that converts the wave train WT into the wave packet WP can be obtained, in which the minimum energy ratio that can be ignored during the light energy adjustment η may be 10%. After adjusting the light energy, the ratio of the characteristic length L2 of the wave packet WP to the wave train length L1 corresponding to the wave train WT is δ. In order to realize stable anti rainbow pattern performance, 0.5 (1−4ndM) (i.e. $0.5\delta n_i L1$) may be configured to be less than or equal to 1.1 times the thickness H of the vacuum gap VG. In this case, it can be ensured that the light emitted by the light-emitting element will not interfere on the upper surface of the first optical microcavity.

Figure 4:
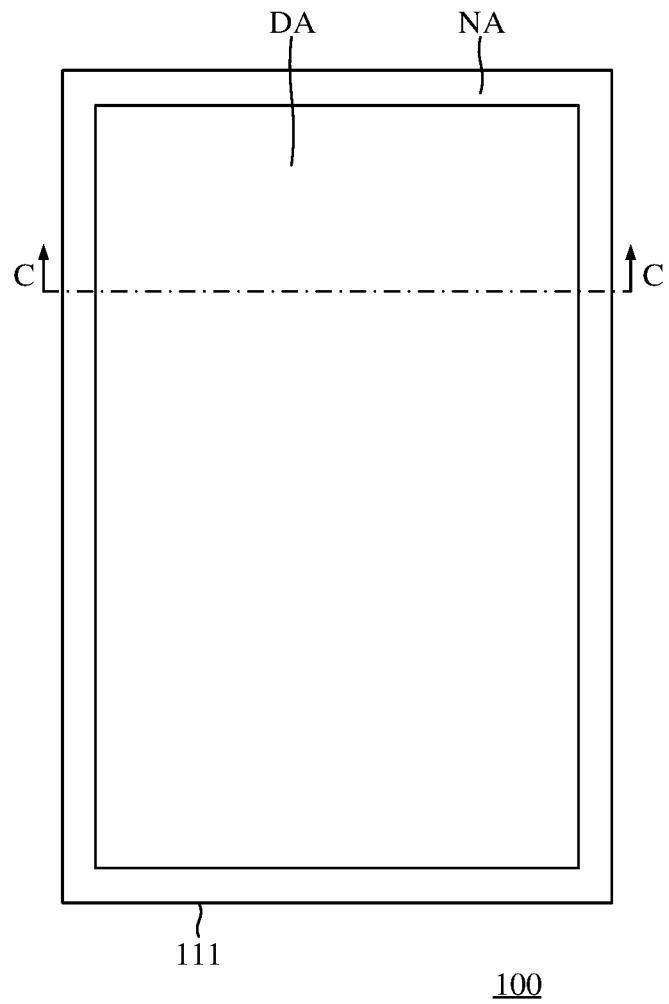
FIG. 4 is a schematic top view of a display panel provided according to a second embodiment of the present application.
Figure 5:
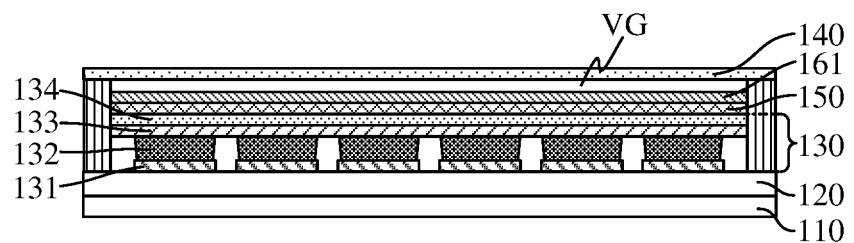
FIG. 5 is a schematic cross-sectional view of the display panel provided according to the second embodiment of the present application.

FIG. 4 and FIG. 5 are respectively a top view and a cross-sectional view of the display panel provided according to a second embodiment of the present application. The C-C line in FIG. 4 shows a cut position of the cross-sectional view of FIG. 5. Most of the structure of the display panel 100 provided by the second embodiment is the same as that of the display panel 100 provided by the first embodiment. The differences between the second embodiment and the first embodiment will be described below, and the similarities will not be described in detail.

In the present embodiment, the light energy adjustment layer 150 is disposed on a surface of the light-emitting element layer 130 facing the encapsulation layer 140. The display panel 100 also includes a first light modulation layer 161, which is disposed on a surface of the light energy adjustment layer 150 facing the encapsulation layer 140, a refractive index of the first light modulation layer 161 is lower than that of the light energy adjustment layer 150, and the transmittance of the light of the preset wavelength between the light energy adjustment layer 150 and the vacuum gap VG may be modulated by the first light modulation layer 161. As viewing at a certain angle with the display surface of the display panel 100, the transmittance of light in different bands under the viewing angle is more uniform, thereby weakening the rainbow pattern problem under the preset viewing angle.

In some embodiments, the first light modulation layer 161 includes at least one of a lithium fluoride layer and a silicon oxide layer. For example, the first light modulation layer 161 is a lithium fluoride layer. The first light modulation layer 161 may be formed by evaporation, electron beam evaporation or the like.

Figure 6:
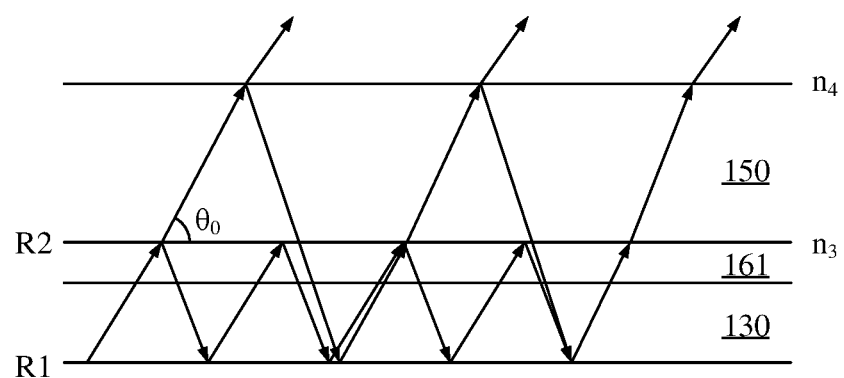
FIG. 6 is a schematic diagram of the principle of passing light modulation of a first light modulation layer in the display panel provided according to the second embodiment of the present application.

FIG. 6 is a schematic diagram of the principle of passing light modulation of a first light modulation layer in the display panel provided according to the second embodiment of the present application, in which the light propagation direction is shown by an arrow. The light-emitting element layer 130 includes a plurality of sub light-emitting element layers. For example, the light-emitting element layer 130 includes a first electrode layer 131, a light-emitting layer 132, a second electrode layer 133 and a capping layer (Capping Layer, CPL) 134 sequentially arranged away from the substrate 110. A first light modulation layer 161 is inserted between the light energy adjustment layer 150 and the vacuum gap VG. In order to modulate the light with preset wavelength and preset angle, the first light modulation layer 150 may be configured to satisfy the following formulas:

$$|E_{cav}(\lambda)|^2 = \frac{(1-R_2)\sum_i\left[1+R_1+2\sqrt{R_1}\cos\left(\frac{4\pi Z_i\cos\theta_0}{\lambda}+\Phi_1\right)\right]}{1+R_1R_2-2\sqrt{R_1R_2}\cos\left(\frac{4\pi L_X\cos\theta_0}{\lambda}+\Phi_1+\Phi_2\right)}|E_{nc}(\lambda)|^2 \quad (6)$$

$$R_2 = \frac{(n_4-n_3)^2\cos^2\left(\frac{\delta'}{2}\right)+\left(\frac{n_4n_3}{n'}-n'\right)^2\sin^2\left(\frac{\delta'}{2}\right)}{(n_4+n_3)^2\cos^2\left(\frac{\delta'}{2}\right)+\left(\frac{n_4n_3}{n'}+n'\right)^2\sin^2\left(\frac{\delta'}{2}\right)} \quad (7)$$

$$\delta' = \frac{2\pi}{\lambda}2n'h'\cos\theta_0 \quad (8)$$

In formulas (6), (7) and (8). λ is a wavelength of light to be adjusted; $|E_{cav}(\lambda)|^2$ is an emission energy spectrum of a single light-emitting element; $|E_{nc}(\lambda)|^2$ is an intrinsic spectrum of light passing through the first light modulation layer; $R_1$ is a light intensity reflectivity of the first electrode layer; $R_2$ is a light intensity reflectivity of the light energy adjustment layer, i is a code of the sub light-emitting element layers included in the light-emitting element layer and the light energy adjustment layer, for example, the sub light-emitting element layers included in the light-emitting element layer has 4 layers in total, and the light energy adjustment layer has 1 layer, i is taken from 1 to 5 in turn; $Z_i$ is a thickness of the film layer numbered i; $\theta_0$ is a viewing angle of luminous dipoles of the light-emitting element to be adjusted; $L_X$ is a cavity length of the second optical microcavity formed between the light-emitting element layer and the light energy adjustment layer; $\Phi_1$ is a phase sudden change caused by the reflection of the first electrode layer, $\Phi_2$ is the phase sudden change caused by the reflection of the light energy adjustment layer, the capping layer and the second electrode layer, $n_3$ is a refractive index of a material on one side of the first light modulation layer facing the substrate, that is, the refractive index of the light energy adjustment layer in this embodiment; $n_4$ is a refractive index of a material on the other side of the first light modulation layer away from the substrate, that is the refractive index of the vacuum gap in this embodiment, which is usually taken as 1; n' is a refractive index of the first light modulation layer; h' is a thickness of the first light modulation layer; δ' refers to a phase difference added by the first light modulation layer to two adjacent columns of the modulated light when the included angle between the incident light of the first light modulation layer and the normal to the first light modulation layer is $θ_0$.

By knowing the angle and wavelength of the light to be adjusted, R2 is obtained by inverse solution in formula (6), R2 is brought into formula (7), and an appropriate first light modulation layer is selected to make a refractive index n' and a thickness h' of the first light modulation layer satisfy formula (7), so that the spectrum of the required outgoing viewing angle may be adjusted by the first light adjustment layer, and the rainbow pattern deviation the display panel under the preset viewing angle may be suppressed to weaken the rainbow pattern effect.

Figure 7:
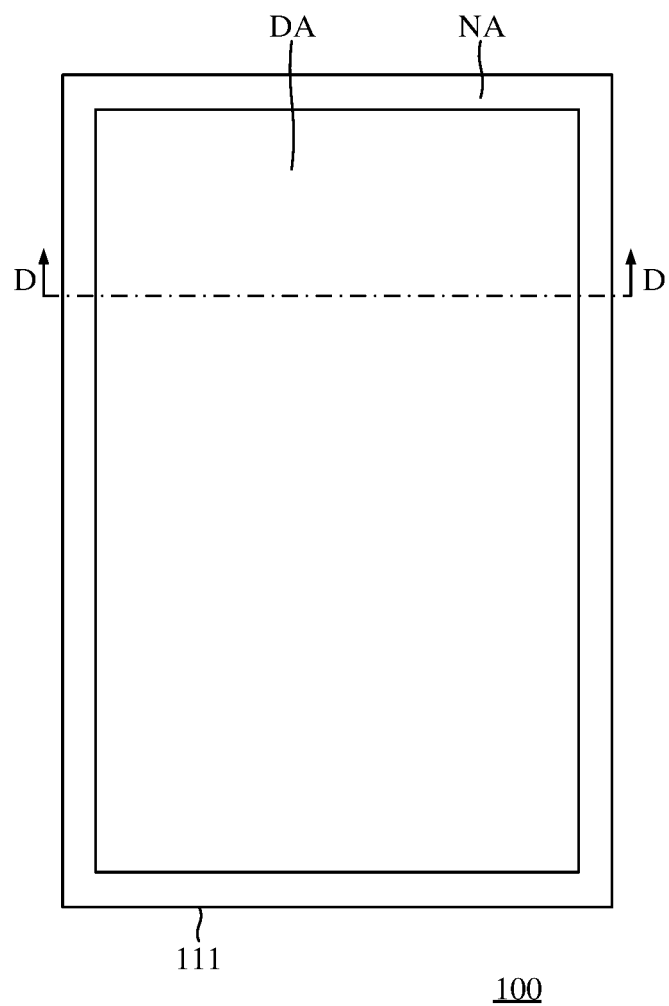
FIG. 7 is a schematic top view of a display panel provided according to a third embodiment of the present application.
Figure 8:
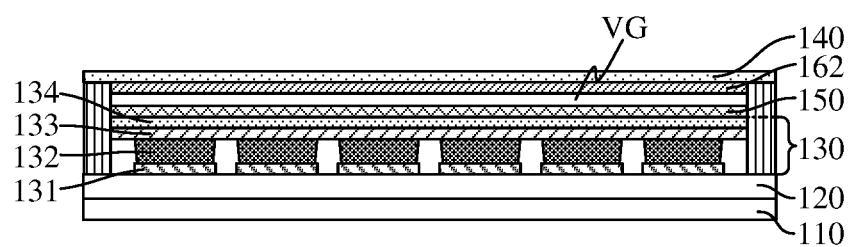
FIG. 8 is a schematic cross-sectional view of the display panel provided according to the third embodiment of the present application.

FIG. 7 and FIG. 8 are respectively a top view and a cross-sectional view of the display panel provided according to a third embodiment of the present application. The line D-D in FIG. 7 shows a cut position of the cross-sectional view of FIG. 8. Most of the structure of the display panel 100 provided by the third embodiment is the same as that of the display panel 100 provided by the first embodiment. The differences between the third embodiment and the first embodiment will be described below, and the similarities will not be described in detail.

In this embodiment, the display panel 100 also includes a second light modulation layer 162 on a surface of the encapsulation layer 140 facing the light-emitting element layer 130. A refractive index of the second light modulation layer 162 is lower than that of the encapsulation layer 140, and the transmittance of the light of the preset wavelength between the encapsulation layer 140 and the vacuum gap VG may be modulated by the second light modulation layer 162. As viewing at a certain angle with the display surface of the display panel 100, the transmittance of light in different bands under the viewing angle is more uniform, thereby weakening the rainbow pattern problem under the preset viewing angle.

In some embodiments, the second light modulation layer 162 includes at least one of a magnesium fluoride layer, and a lithium fluoride layer. For example, the second layer 162 is a magnesium fluoride layer. The second light modulation layer 162 may be formed by magnetron sputtering and electron beam evaporation or the like. In some embodiments, the second light modulation layer 162 may also be integrated with the encapsulation layer 140.

By knowing the angle and wavelength of the light to be adjusted, a refractive index n" and a thickness h" of the second light modulation layer 162 may be adjusted. Wherein the selection method for these may be similar to that of the refractive index n' and the thickness h' of the first light modulation layer in the second embodiment, so as to suppress the rainbow pattern deviation of the display panel under the preset viewing angle and achieve the effect of weakening the rainbow pattern.

In the second embodiment, the light modulation layer of the display panel 100 may include only the first light modulation layer 161. In the third embodiment, the light modulation layer of the display panel 100 may include only the second light modulation layer 162. However, the setting of the light modulation layer in the display panel 100 may not be limited to the above examples.

Figure 9:
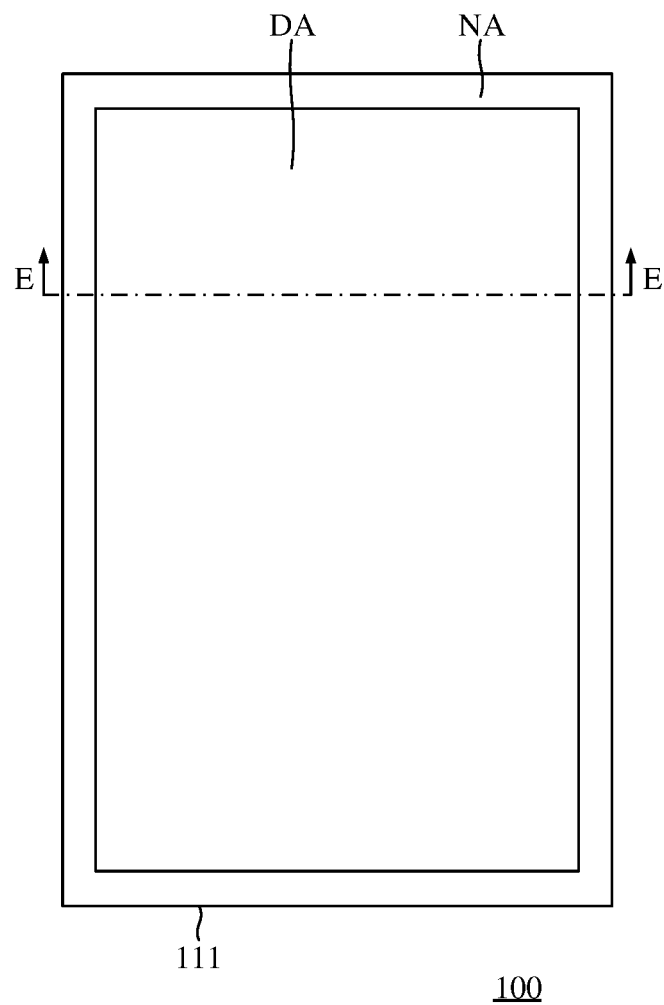
FIG. 9 is a schematic top view of a display panel provided according to a fourth embodiment of the present application.
Figure 10:
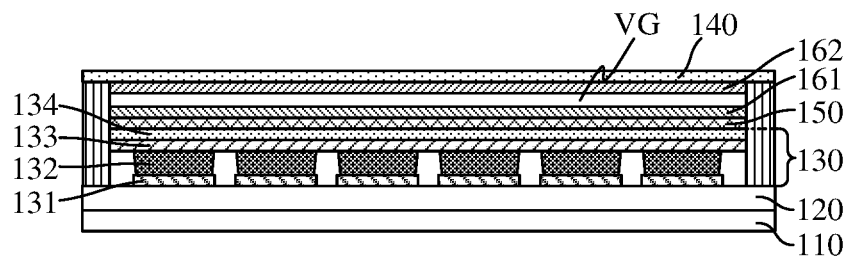
FIG. 10 is a schematic cross-sectional view of the display panel provided according to the fourth embodiment of the present application.

FIG. 9 and FIG. 10 are respectively a top view and a cross-sectional view of the display panel provided according to a fourth embodiment of the present application. The line E-E in FIG. 9 shows a cut position of the cross-sectional diagram of FIG. 10. In the fourth embodiment, the display panel 100 includes both a first light modulation layer 161 and a second light modulation layer 162. The light energy adjustment layer 150 is disposed on a surface of the light-emitting element layer 130 facing the encapsulation layer 140, the first light modulation layer 161 is disposed on a surface of the light energy adjustment layer 150 facing the encapsulation layer 140, and a refractive index of the first light modulation layer 161 is lower than that of the light energy adjustment layer 150. The second light modulation layer 162 is disposed on a surface of the encapsulation layer 140 facing the light-emitting element layer 130, and a refractive index of the second light modulation layer 162 is lower than that of the encapsulation layer 140. The transmittance of the light of the preset wavelength between the encapsulation layer 140 and the vacuum gap VG may be modulated by the first light modulation layer 161 and the second light modulation layer 162 respectively. As viewing at a certain angle with the display surface of the display panel 100, the transmittance of light in different bands under the viewing angle is more uniform, thereby weakening the rainbow pattern problem under the preset viewing angle.

In some embodiments, the first light modulation layer 161 and the second light modulation layer 162 may be used to adjust the transmittance of light with different wavelengths respectively. In this case, the refractive index n' and thickness h' of the first light modulation layer may be selected for the first wavelength, and the refractive index n" and thickness h" of the second light modulation layer 162 may be selected for the second wavelength, so that the transmittance of the light of two wavelengths may be adjusted by the light adjustment layer of the display panel, so as to further improve the uniformity of the transmittance of the light of multiple bands under the viewing angle.

Figure 11:
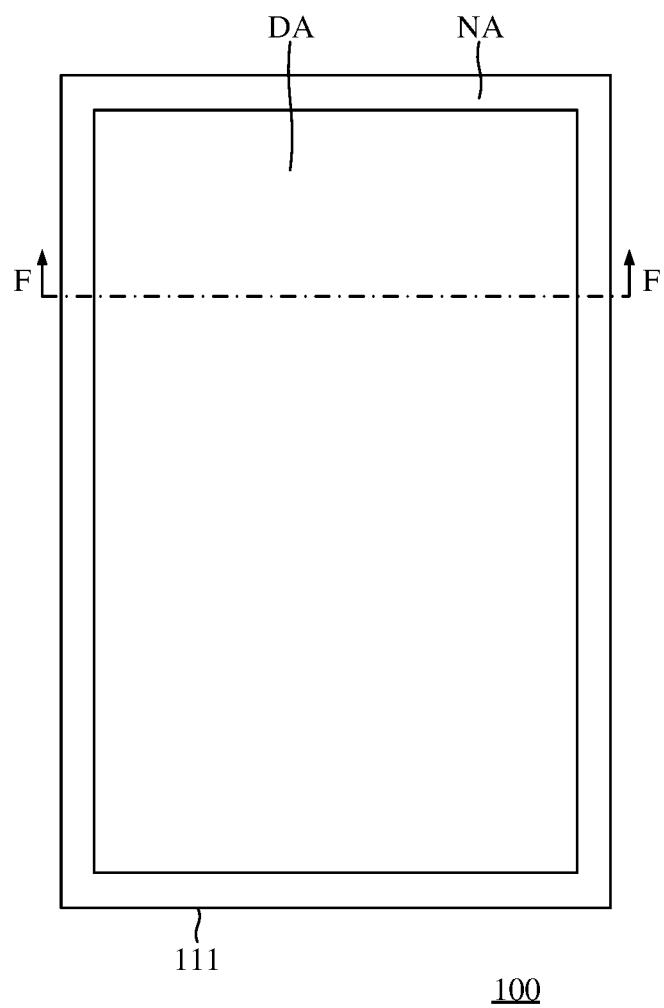
FIG. 11 is a schematic top view of a display panel provided according to a fifth embodiment of the present application.
Figure 12:
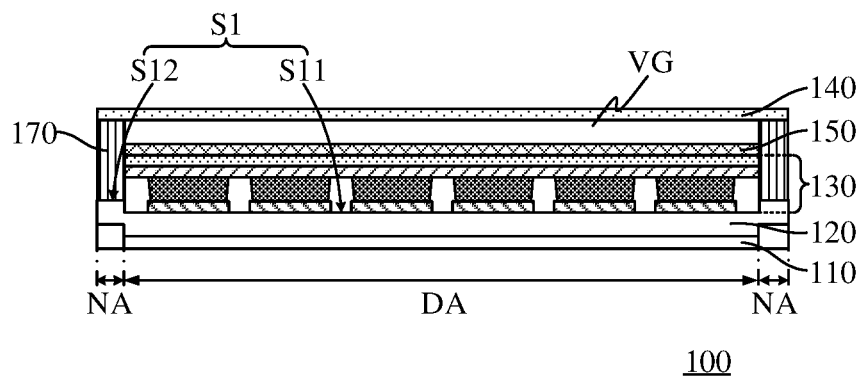
FIG. 12 is a schematic cross-sectional view of the display panel provided according to the fifth embodiment of the present application.

FIG. 11 and FIG. 12 are respectively a top view and a cross-sectional view of the display panel provided according to a fifth embodiment of the present application. The line F-F in FIG. 11 shows a cut position of the cross-sectional view of FIG. 12. Most of the structure of the display panel 100 provided by the fifth embodiment is the same as that of the display panel 100 provided by the first embodiment. The differences between the fifth embodiment and the first embodiment will be described below, and the similarities will not be described in detail.

Figure 13:
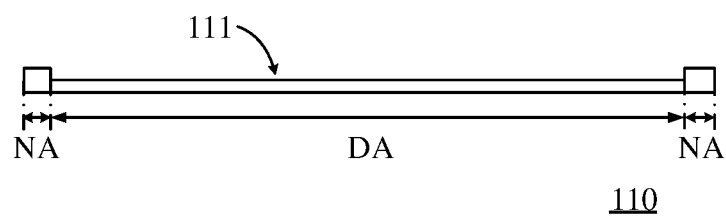
FIG. 13 is a schematic cross-sectional view of a substrate in the display panel provided according to the fifth embodiment of the present application.

FIG. 13 is a schematic cross-sectional view of a substrate in a display panel provided according to the fifth embodiment of the present application. The substrate 110 includes a display area DA and a non-display area NA surrounding the periphery of the display area DA. In the present embodiment, the substrate 110 is provided with a recess 111 on a surface facing the light-emitting element layer 130, and the recess 111 is located in the display area DA.

The display panel 100 also includes a driving array layer 120 between the substrate 110 and the light-emitting element layer 130. The driving array layer 120 is located in the display area DA and the non-display area NA. The display panel 100 may include an encapsulation connecting member 170, which is arranged around the display area DA in the non-display area NA, and the encapsulation connecting member 170 is connected between the driving array layer 120 and the encapsulation layer 140. The driving array layer 120 includes a first surface S1 facing the encapsulation layer 140, and the first surface S1 includes a first sub surface S11 located in the display area DA and a second sub surface S12 located in the non-display area NA. The distance between the first sub surface S11 and the encapsulation layer 140 is greater than the distance between the second sub surface S12 and the encapsulation layer 140.

By setting a recess 111 on the substrate 110, the driving array layer 120 is made to sink into the recess 111 in the display area DA, so that the light-emitting element layer 130 located in the display area DA translates in the direction close to the substrate 110, while the position of the encapsulation layer 140 remains unchanged, so that the thickness of the vacuum gap VG between the encapsulation layer 140 and the light-emitting element layer 130 increases. Thus, the optical path between the light-emitting element layer 130 and the encapsulation layer 140 is increased, and the possibility of interference of the light emitted by the light-emitting element at the surface of the encapsulation layer 140 is reduced, so as to reduce the influence of the first optical microcavity between the encapsulation layer 140 and the light-emitting element layer 130 on the emission spectrum of the display panel 100 under the preset viewing angle, and the rainbow pattern problem of the display panel 100 in some viewing angles is improved to a certain extent.

In some embodiments, the depth of the recess 11 is 10 microns to 16 microns, which ensures that the substrate 110 has sufficient support while improving the rainbow pattern problem to a certain extent. The recess 111 on the substrate 110 can be formed by etching process or integrated with the substrate 110.

Figure 14:
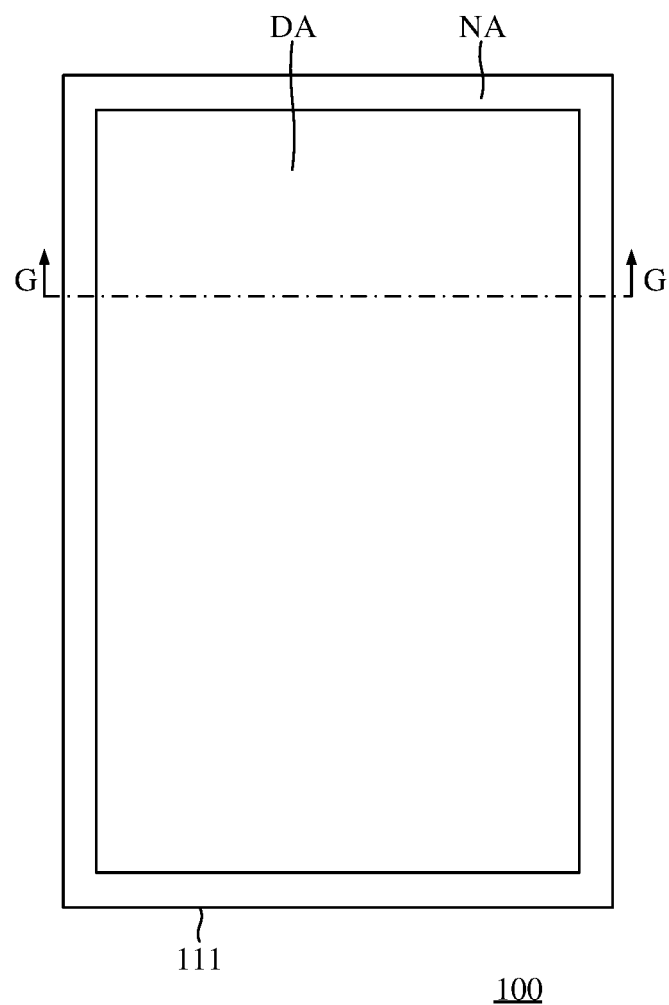
FIG. 14 is a schematic top view of a display panel provided according to a sixth embodiment of the present application.
Figure 15:
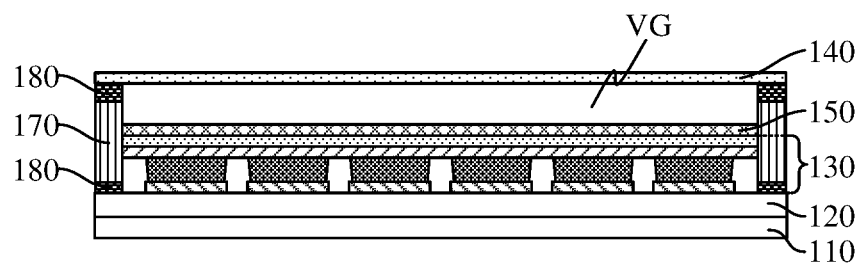
FIG. 15 is a schematic cross-sectional view of the display panel provided according to the sixth embodiment of the present application.

FIG. 14 and FIG. 15 are respectively a top view and a cross-sectional view of the display panel provided according to a sixth embodiment of the present application. The line G-G in FIG. 14 shows a cut position of the cross-sectional diagram of FIG. 15. Most of the structure of the display panel 100 provided by the sixth embodiment is the same as that of the display panel 100 provided by the first embodiment. The differences between the sixth embodiment and the first embodiment will be described below, and the similarities will not be described in detail.

The substrate 110 includes a display area DA and a non-display area NA surrounding the periphery of the display area DA, and the light-emitting element layer 130 is located in the display area DA. The display panel 100 includes a driving array layer 120 and an encapsulation connecting member 170. The driving array layer 120 is located between the substrate 110 and the light-emitting element layer 130, and the driving array layer 120 is located in the display area DA and the non-display area NA. The encapsulation connecting member 170 is arranged around the display area DA in the non-display area NA, and the encapsulation connecting member 170 is connected between the driving array layer 120 and the encapsulation layer 140.

The display panel 100 may also include an encapsulation layer heightening member 180 connected between the encapsulation connecting member 170 and the driving array layer 120, and/or between the encapsulation connecting member 170 and the encapsulation layer 140. For example, in this embodiment, an encapsulation layer heightening member 180 is arranged between the encapsulation connecting member 170 and the driving array layer 120, and between the encapsulation connecting member 170 and the encapsulation layer 140. In other embodiments, the encapsulation layer heightening member 180 may be provided only between the encapsulation connecting member 170 and the driving array layer 120, or the encapsulation layer heightening member 180 may be provided only between the encapsulation connecting member 170 and the encapsulation layer 140.

By setting the encapsulation layer heightening member 180, the encapsulation layer 140 is translated away from the light-emitting element layer 130, and the thickness of the vacuum gap VG between the encapsulation layer 140 and the light-emitting element layer 130 is increased, so as to increase the optical path of light between the light-emitting element layer 130 and the encapsulation layer 140 and reduce the possibility of interference of light emitted by the light-emitting element at the surface of the encapsulation layer 140. Thus, the influence of the first optical microcavity between the encapsulation layer 140 and the light-emitting element layer 130 on the emission spectrum of the display panel 100 under the preset viewing angle is reduced, and the rainbow pattern problem of the display panel 100 under some viewing angles is improved to a certain extent.

In some embodiments, the encapsulation layer heightening member 180 between the encapsulation connecting member 170 and the driving array layer 120 may be formed by patterning with at least part of the film layer of the driving array layer 120 during the formation of the driving array layer 120, or by evaporation with at least part of the film layer of the light-emitting element layer 130 during the formation of the light-emitting element layer 130. In some embodiments, the encapsulation layer heightening member 180 between the encapsulation connecting member 170 and the encapsulation layer 140 may be formed with at least part of the film layer of the light-emitting element layer 130 by evaporation mask during the formation of the light-emitting element layer 130, or by integrating with the encapsulation layer 140.

According to the embodiments of the present application as described above, these embodiments do not describe all the details in detail, nor do they limit the present application to only the specific embodiments described above. Obviously, according to the above description, many modifications and changes can be made. The purpose of selecting and specifically describing these embodiments in this specification is to better explain the principle and practical application of the present application, so that those skilled in the art can make good use of the present application and the modification and use based on the present application. This application is limited only by the claims and full scope and equivalents thereof.

What is claimed is:
1. A display panel, comprising
   a substrate;
   a light-emitting element layer disposed on the substrate, comprising a plurality of light-emitting elements;
   an encapsulation layer disposed on one side of the light-emitting element layer away from the substrate; and
   a light energy adjustment layer disposed between the light-emitting element layer and the encapsulation layer, the light energy adjustment layer being capable of converting each wave train of light passing through it into a wave packet, wherein a characteristic length of the wave packet is less than a wave train length of the wave train;
   wherein a vacuum gap is disposed between the encapsulation layer and the light-emitting element layer to form an optical microcavity; and
   wherein a refractive index and a thickness of the light energy adjustment layer satisfy the following formula:

$0.5(1-4ndM) \leq 1.1H;$ wherein n is the refractive index of the light energy adjustment layer;

d is the thickness of the light energy adjustment layer;

M is a positive integer constant;

H is a thickness of the vacuum gap.

2. The display panel of claim 1, wherein light energy of the wave packet accounts for more than 90% of light energy of the wave train corresponding to the wave packet.

3. The display panel of claim 1, wherein the light energy adjustment layer comprises at least one of a titanium dioxide layer and a zinc oxide layer.

4. The display panel of claim 1, wherein the light energy adjustment layer is disposed on a surface of the light-emitting element layer facing the encapsulation layer, and the display panel further comprises:
 a first light modulation layer disposed on a surface of the light energy adjustment layer facing the encapsulation layer, wherein a refractive index of the first light modulation layer is lower than that of the light energy adjustment layer.

5. The display panel of claim 4, wherein the first light modulation layer comprises at least one of a lithium fluoride layer and a silicon oxide layer.

6. The display panel of claim 4, further comprising
 a second light modulation layer disposed on a surface of the encapsulation layer facing the light-emitting element layer, wherein a refractive index of the second light modulation layer is lower than that of the encapsulation layer.

7. The display panel of claim 6, wherein the second light modulation layer comprises at least one of a magnesium fluoride layer and a lithium fluoride layer.

8. The display panel of claim 6, wherein the first light modulation layer and the second light modulation layer are respectively configured to adjust a transmittance of light with different wavelengths.

9. The display panel of claim 1, further comprising
 a driving array layer disposed between the substrate and the light-emitting element layer, the driving array layer comprising a plurality of pixel driving circuits, and each pixel driving circuit being electrically connected to the light-emitting element corresponding to the pixel driving circuit.

10. The display panel of claim 1, wherein the substrate comprises a display area and a non-display area surrounding the display area, a recess disposed in the display area is provided on a surface of the substrate facing the light-emitting element layer, and the display panel further comprises:
 a driving array layer disposed between the substrate and the light-emitting element layer, the driving array layer being disposed in the display area and the non-display area, wherein the driving array layer comprises a first surface facing the encapsulation layer, and the first surface comprises a first sub-surface in the display area and a second sub-surface in the non-display area, a distance between the first sub-surface and the encapsulation layer is greater than a distance between the second sub-surface and the encapsulation layer.

11. The display panel of claim 10, wherein a depth of the recess is from 10 microns to 16 microns.

12. The display panel of claim 1, wherein the substrate comprises a display area and a non-display area surrounding the display area, the light-emitting element layer is disposed in the display area, and the display panel further comprises:
 a driving array layer disposed between the substrate and the light-emitting element layer, the driving array layer being disposed in the display area and the non-display area;
 an encapsulation connecting member arranged around the display area in the non-display area, the encapsulation connecting member being connected between the drive array layer and the encapsulation layer.

13. The display panel of claim 12, further comprising
 an encapsulation layer heightening member connected between the encapsulation connecting member and the driving array layer.

14. The display panel of claim 13, wherein the encapsulation layer heightening member and at least part of a film layer of the driving array layer are formed by a patterning process during a formation of the driving array layer; and/or
 the encapsulation layer heightening member and at least part of a film layer of the light-emitting element layer are formed by an evaporation process using an evaporation mask during a formation of the light-emitting element layer.

15. The display panel of claim 12, further comprising
 an encapsulation layer heightening member connected between the encapsulation connecting member and the encapsulation layer.

16. The display panel of claim 15, wherein the encapsulation layer heightening member and at least part of a film layer of the light-emitting element layer are formed by an evaporation process using an evaporation mask during a formation of the light-emitting element layer; and/or
 the encapsulation layer heightening member is integrated with the encapsulation layer.

17. The display panel of claim 1, wherein the light energy adjustment layer is a single layer film structure or a laminated film system.

18. The display panel of claim 1, wherein the encapsulation layer is a hard encapsulation layer.

* * * * *